(12) United States Patent
Zaluzec

(10) Patent No.: US 8,314,386 B2
(45) Date of Patent: Nov. 20, 2012

(54) HIGH COLLECTION EFFICIENCY X-RAY SPECTROMETER SYSTEM WITH INTEGRATED ELECTRON BEAM STOP, ELECTRON DETECTOR AND X-RAY DETECTOR FOR USE ON ELECTRON-OPTICAL BEAM LINES AND MICROSCOPES

(75) Inventor: Nestor J. Zaluzec, Bolingbrook, IL (US)

(73) Assignee: UChicago Argonne, LLC, Chicago, IL (US)

( * ) Notice: Subject to any disclaimer, the term of this patent is extended or adjusted under 35 U.S.C. 154(b) by 47 days.

(21) Appl. No.: 13/041,265

(22) Filed: Mar. 4, 2011

(65) Prior Publication Data

US 2012/0160999 A1 Jun. 28, 2012

Related U.S. Application Data

(60) Provisional application No. 61/317,847, filed on Mar. 26, 2010.

(51) Int. Cl.
*G01N 23/02* (2006.01)

(52) U.S. Cl. .......... 250/306; 250/307; 250/310

(58) Field of Classification Search .......... None
See application file for complete search history.

(56) References Cited

U.S. PATENT DOCUMENTS

| | | | |
|---|---|---|---|
| 2,372,422 A | 3/1945 | Hillier | |
| 3,191,028 A | 6/1965 | Crewe | |
| 3,924,126 A * | 12/1975 | Anderson et al. | 250/311 |
| 4,099,055 A * | 7/1978 | Todokoro | 250/311 |
| 4,870,281 A * | 9/1989 | Van Der Borst et al. | 250/374 |
| 4,910,399 A * | 3/1990 | Taira et al. | 250/310 |
| 5,065,020 A * | 11/1991 | Kanda | 850/9 |
| 5,266,802 A * | 11/1993 | Kasai | 250/310 |
| 5,289,005 A * | 2/1994 | Naruse et al. | 250/310 |
| 5,510,624 A | 4/1996 | Zaluzec | |
| 5,569,925 A * | 10/1996 | Quinn et al. | 250/370.06 |
| 5,635,714 A * | 6/1997 | Nablo et al. | 250/305 |
| 5,644,612 A * | 7/1997 | Moorman et al. | 378/98.2 |
| 5,714,875 A | 2/1998 | Lawrence et al. | |
| 5,903,004 A * | 5/1999 | Koshihara et al. | 250/310 |
| 6,153,883 A * | 11/2000 | Arai | 250/370.15 |
| 6,410,923 B1 * | 6/2002 | Crewe | 250/396 ML |

(Continued)

OTHER PUBLICATIONS

The Mechanical and Shielding Design of a Portable Spectrometer and Beam Dump Assembly at Bnl's Accelerator Test Facility' by J.-P. Hu et al., 2nd International Workshop on Mechanical Engineering Design of Synchrotron Radiation Equipment and Instrumentation (MEDSIO2) Sep. 5-6, 2002 - Advanced Photon Source, Argonne National Laboratory, Argonne, Illinois Usa.

*Primary Examiner* — David A Vanore
*Assistant Examiner* — Andrew Smyth
(74) *Attorney, Agent, or Firm* — Joan Pennington

(57) ABSTRACT

An X-ray spectrometer systems and methods are provided for implementing signal detection for use on electron-optical beam lines and microscopes. The X-ray Spectrometer System (XSS) includes an X-ray detector (XD) measuring the X-ray signal and positioned proximate to a specimen. An environmental isolation window together with an electron beam stop is disposed between XD and the specimen. The environmental isolation window and the electron beam stop protect XD from electrons directly transmitted through the specimen. An electron detector is located between the electron beam stop and the specimen allowing the measurement of scattered electrons. The XD measures an X-ray signal in the X-ray spectrometer system.

20 Claims, 11 Drawing Sheets

U.S. PATENT DOCUMENTS

| | | | |
|---|---|---|---|
| 6,412,978 B1* | 7/2002 | Watanabe et al. | 378/197 |
| 6,455,858 B1 | 9/2002 | Patt et al. | |
| 6,476,612 B1 | 11/2002 | Ellefson et al. | |
| 6,548,810 B2 | 4/2003 | Zaluzec | |
| 6,794,648 B2 | 9/2004 | Kaji et al. | |
| 7,035,379 B2* | 4/2006 | Turner et al. | 378/140 |
| 7,129,501 B2 | 10/2006 | Iwanczyk et al. | |
| 8,164,057 B2* | 4/2012 | Shachal | 250/307 |
| 2003/0025075 A1* | 2/2003 | Zaluzec | 250/306 |
| 2004/0183012 A1* | 9/2004 | Yaguchi et al. | 250/306 |
| 2007/0252091 A1* | 11/2007 | Terada et al. | 250/442.11 |
| 2008/0181365 A1* | 7/2008 | Matoba | 378/140 |
| 2008/0310595 A1* | 12/2008 | Bertozzi et al. | 378/140 |
| 2009/0032715 A1* | 2/2009 | Mott | 250/363.01 |
| 2009/0146075 A1 | 6/2009 | Schmid et al. | |
| 2009/0194691 A1* | 8/2009 | Kaji | 250/311 |
| 2009/0302234 A1* | 12/2009 | Terada et al. | 250/442.11 |
| 2010/0140470 A1* | 6/2010 | Shachal | 250/307 |
| 2010/0303198 A1* | 12/2010 | Hampel | 378/16 |
| 2011/0168889 A1* | 7/2011 | Shachal et al. | 250/307 |

* cited by examiner

HIGH COLLECTION EFFICIENCY X-RAY SPECTROMETER SYSTEM WITH INTEGRATED ELECTRON BEAM STOP, ELECTRON DETECTOR AND X-RAY DETECTOR FOR USE ON ELECTRON-OPTICAL BEAM LINES AND MICROSCOPES

This application claims the benefit of U.S. Provisional Application No. 61/317,847 filed on Mar. 26, 2010.

CONTRACTUAL ORIGIN OF THE INVENTION

The United States Government has rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

FIELD OF THE INVENTION

The present invention relates generally to the field of micro-analytical studies of materials including nano-materials, and more particularly, relates to an X-ray spectrometer system with integrated electron beam stop, electron and X-ray detectors for use on electron-optical beam lines and equivalent microscopes used for imaging and elemental analysis.

DESCRIPTION OF THE RELATED ART

The ability to characterize a substance is of critical importance to the ability to understand, engineer and developing new and advanced materials, which are needed by our technologically driven society. The capability to detect with high-collection efficiency and, in future, to analyze quantitatively smaller and smaller volumes of material has become increasingly important, particularly with the growth of nano-materials. Scientists and engineers use a wealth of complex analytical tools design to measure the morphology, crystallography, elemental, chemical and electronic structure of advanced materials. Depending upon the specimen and the choice of analysis method, the nature of the information to be measured can vary over a wide range. Regardless of this variability, effectively characterizing a material rests on the ability to detect a signal that is derived from the interaction of a stimulus or probe and specimen. With better resources including, for example, expertise, instrumentation, and data, an investigator's ability to undertake new and more complicated challenges can be dramatically improved.

In nano-materials research, one of the commonly employed tools is the electron microscope or its equivalent electron-optical beam line. After scattered electrons, the signal next most often measured in these instruments is that of emitted X-rays. These X-rays are used to quantitatively measure the composition of a region of interest which can range from tens of millimeters to sub-atomic dimensions. The detector most used during the last 40 years has been the energy-dispersive spectrometer (EDS), either of the mono-lithic solid state Si(Li) detector, high purity Germanium or, more recently, the silicon drift detector (SDD). On one hand these detectors are remarkably simple and efficient, but on the other hand there are opportunities for improvement.

One of the factors governing the ability to measure an X-ray signal is the detectors geometrical collection efficiency, which is typically defined in terms of its collection solid angle ($\Omega$). This efficiency is a measure of total signal detected relative to the total signal emitted from the specimen. Put in another way, $\Omega$ is a measure the amount of angular surface in three-dimensional space, which the detector subtends. A detector having 100% geometrical collection efficiency for a signal emitted, for example, from the surface of a specimen, would subtend the solid angle equivalent to a perfect hemisphere. This would be equivalent to a collection solid angle of $2\pi$ sr.

In conventional analytical instruments the geometry most commonly employed today is simple. An incident probe illuminates a region of interest of a specimen and an X-ray detector of active area (A) is positioned a distance (d) away from and above the specimen to measure the emitted signal, which generated by the probe/specimen interaction from the selected region, as illustrated in FIG. 1. This conventional specimen/detector geometry gives rise to a relatively poor collection solid angle because of the small detector size and relatively large distances involved.

FIG. 2 illustrates a calculation of the solid angle as a function of detector area and its distance from the specimen for the geometry, which found in electron-optical instruments. Typical EDS systems have for example, detector active areas (A) of 10-100 $mm^2$ area and are located a distance (d) of ~10-50 mm from the specimen as indicated in the chart by the region marked by the arrow and labeled as Prior Art. For EDS systems interfaced to scanning electron microscopes (SEMs), the typical values of solid angle can range from <0.005 to ~0.1 steradians, while in transmission or scanning-transmission electron microscopes (TEM/STEMs) values of solid angle of up to ~0.1-0.3 sr are achievable. On a percentage basis, an EDS system having a solid angle of ~0.1 sr collects only about 1.6% of the available signal, in other words, for the majority of instruments used today, more than 98% of the available signal is being neglected.

There are a number of approaches that can be used to improve the detector solid angle in EDS systems such as increasing the detector active area, the number of detectors, or detector arrays. These approaches have been employed in both SEM and TEM/STEM systems. For example, using quad-detector geometries, improvements of a factor of four have been reported in an SEM. However, to achieve significant improvement of more than an order of magnitude improvement, a radically different approach is required.

To make a revolutionary advance in the collection solid angle $\Omega$, first the nature of the measurement and the question posed must be reconsidered. If the task is to measure the composition and structure of individual nano-particles, then it is essential to tailor the experimental configuration to maximize the data collection ability. This is particularly true in nano-materials research where ultra thin cross-sections or individual particles are being characterized. In nanoparticle research, the ultra small particles can readily be dispersed on ultra thin self-supporting films, such as those used in the TEM/STEM investigations. These support films include holey carbon films, thin self-supporting substrates, such as, C, SiN, SiO films, or upon thin substrates created using any number of modern atomic-layer deposition processes. In other situations, thin-films or cross-sections of materials of interest may be prepared from bulk materials by a variety of crushing, grinding, electro-chemical, chemical, deposition and/or charged particle erosion methods followed by support or attachments to a rigid grid or substrate. In all cases, for the analysis of nano-scale regions of interest, the problem during X-ray analysis for this type of specimen is not too many counts, but rather that there is so little material present that the signal is meager at best. For example, under good conditions, for particle sizes less than ~10 nm, in an electron microscope using traditional configurations for x-ray spectroscopy, the full-spectrum count rate is rarely more than a few hundred counts/sec. Since these geometries are collecting <2% of the available signal, there is significant room for improvement.

As used in the following specification and claims, each of the terms "annular detector" and "annular X-ray detector" should be understood to broadly include an annular, segmented, multiple segmented or multi-element detector having at least one beam passage aperture.

SUMMARY OF THE INVENTION

A principal aspect of the present invention is to provide an enhanced high collection efficiency X-ray spectrometer system utilizing novel configurations of an x-ray detector for use on electron-optical beam lines or microscopes. Another aspect of the present invention is to provide an enhanced high collection efficiency X-ray spectrometer system and novel x-ray detector geometry with integrated electron beam stop for use on electron-optical beam lines or microscopes. Another aspect of this invention is to provide an enhanced high collection efficiency X-ray spectrometer system and novel x-ray detector geometry with integrated electron beam stop combined with an optimized electron detector for use on electron-optical beam lines or microscopes. Other important aspects of the present invention are to provide such X-ray spectrometer systems substantially without negative effects and that overcomes some of the disadvantages of prior art arrangements.

In brief, an X-ray spectrometer system and methods are provided for implementing signal detection for use on electron-optical beam lines and microscopes. The X-ray Spectrometer System (XSS) includes an X-ray detector (XD) positioned proximate to a specimen. An environmental isolation window together with an electron beam stop is disposed between X-ray detector (XD) and the specimen. The environmental isolation window and the electron beam stop protect the X-ray detector (XD) from electrons scattered from the specimen. The X-ray detector (XD) measures an X-ray signal in the X-ray spectrometer system.

In accordance with features of the invention, the X-ray detector is fabricated from Si, Si(Li), Ge or other semi-conducting material, which produces a detectable signal that is proportional to the energy deposited in the material by incident photons, electrons or other charged particles. The detector in this invention may be made up of a single monolithic detector, an annulus, or an array of detectors arranged in a space filling geometry.

In accordance with features of the invention, the X-ray detector is positioned below and proximate to the specimen, minimizing the distance between the XD and the specimen to enhance data collection ability of the X-ray signal. When located below the specimen the XD is protected from direct electron bombardment by the electron beam stop (EBS).

In accordance with features of the invention, the XSS includes an electron detector (ED). Single or multiple electron detectors (EDs) are located between the specimen and the XD in the XSS, for example, near the location of the EBS or the ECW.

In accordance with features of the invention, the electron beam stop includes a stack of, for example, 1 mm diameter disks including of layers of Be and Tantalum, each layer approximately 100 μm thick. Electrons directly transmitted through a specimen do not penetrate the electron beam stop and thus do not enter the XD. A limited number of high angle scattered electrons do circumvent the beam stop however they are of significantly reduced number and thus do not obviate an analysis. The XD optionally is enclosed in a stainless steel housing The EBS is supported by electrically conductive material preferably in the form of small cross-section wires, fibers or bars. These support fibers are of mean atomic number $\leq 29$, the preferred material being carbon-based (Z=6). The fibers have a nominal cross-section of $\leq 100$ μm and are as long as needed to support the electron beam stop. The number and orientation of the fibers is chosen to minimize their deleterious effect on the active area of the XD yet provide both support as well as serve as an electrical connection pathway. In addition the choice of material for these fibers is such so not to create significant spurious X-ray systems peaks.

In accordance with features of the invention, the environmental isolation window is a customizable and removable electrically conductive window (ECW). The ECW is composed of a single or a multi-layered thin film with mean atomic number $\leq 14$, such as beryllium (Be), boron (B), diamond (C), hydrocarbon polymers, aluminum (Al), silicon (Si), or associated compounds; such as such as BN, AlN, AlO, SiN, SiO The ECW is also a protective device for the XD and its primary role in this invention is to diminish high angle scattered electron flux from reaching the XD due to the collective scattering of electrons beyond the subtending angle defined by the EBS. The structure and composition of the window material is also selected to minimize UV/VIS/IR photons having energy <50 eV, from reaching the XD and creating low energy signal and/or noise.

In accordance with features of the invention, the post specimen X-ray detector may also be implemented as an annular or multiple segmented detector. Such a configuration would be typically used in a TEM/STEM environment. In order to permit the electron beam to proceed through the rest of the electron-optical column the incorporation of a post-specimen beam passage aperture is required and the EBS optionally is not installed.

In accordance with features of the invention, a XSS positioning mechanism includes a standard insertion mechanism, which is interfaced to the associated microscope. Sensors or mechanical stops are provided with the XSS positioning mechanism for accurate detector positioning.

In accordance with features of the invention, accurate positioning of the specimen-to-detector distance is achieved by a z-height positioning mechanism of an instrument stage, while imaging of the specimen is accomplished using conventional secondary, backscattered and/or transmission electron detectors or by the electron detection system incorporated into the XSS.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 illustrates the calculation for a transmission X-ray spectrometer system including a X-ray detector (XD) positioned below a specimen in accordance with the preferred embodiment;

DETAILED DESCRIPTION OF THE PREFERRED EMBODIMENTS

Figure 1:
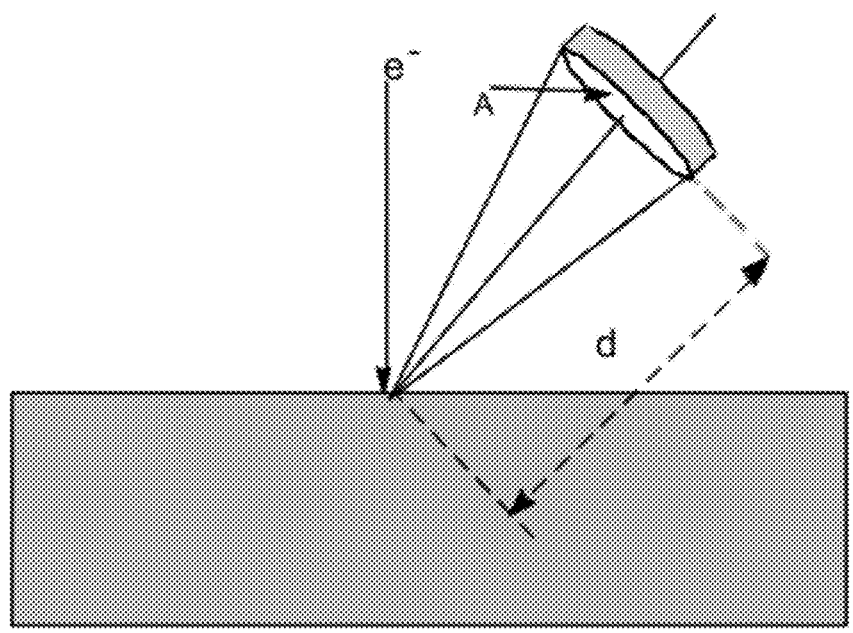
FIG. 1 is chart illustrating the geometry of the solid angle as a function of detector size and location for the standard detector geometry for known electron-optical instruments with conventional detector geometry.
Figure 2:
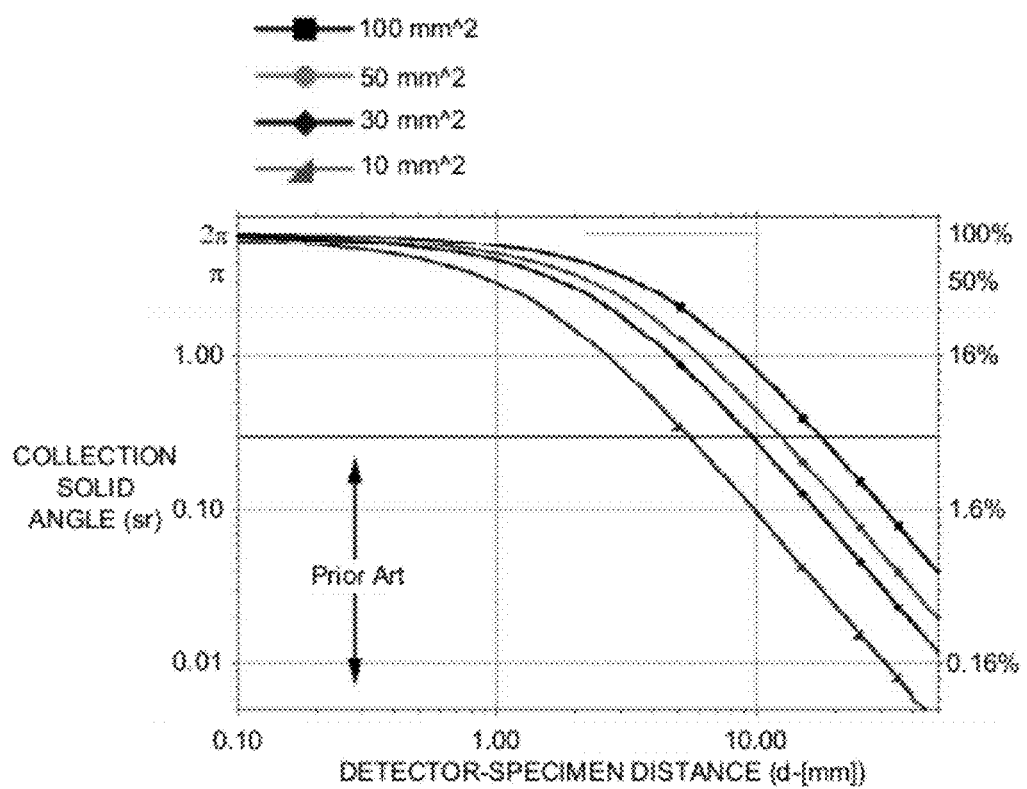
FIG. 2 is chart illustrating a calculation of the solid angle as a function of detector size and location for the detector geometry in electron-optical instruments for x-ray detectors of Area=10, 30, 50, and 100 mm$^2$ with prior art operation is indicated by the arrowed region of this figure, while this invention extends this range to greater than ¼ steradians where

An improvement of approximately an order of magnitude over conventional arrangements such as illustrated in FIG. 1, has been accomplished through the present invention described in the following. A novel X-ray detector (XD) of the invention provides enhanced performance, measuring the X-ray signal in the novel transmission configuration.

Having reference now to the drawings, in FIG. 3, there is shown a transmission X-ray spectrometer system generally designated by the reference character 100 in accordance with the preferred embodiment including an X-ray detector (XD) 102 positioned in a transmission configuration below a specimen 104 within a specimen stage 106 in accordance with a preferred embodiment. A downwardly directed arrow above the specimen 104 represents an incident probe 108. In the following description, the same reference numbers are used for the same or similar components of each illustrated X-ray spectrometer system 100.

An electron beam stop (EBS) 112 is disposed between the X-ray detector (XD) 102 and the specimen 104. The electron beam stop (EBS) 112 is supported by a plurality of fine wires 114 or fiber supports 114. An electron detector (ED) 116 is positioned above the EBS 112. A cover 118 supports the fiber supports 114 and a customized, exchangeable and removable window 120 carried by a housing 122.

The specimen stage 106 is specially constructed of low atomic number material, such as $Z \leq 14$, preferable Be (Z=3) to hold the self supporting thin specimen 104 or nano-particles on a grid and surround it by material which generates minimal spurious X-rays. This low atomic number material is only required in the area of the specimen stage 106 immediately surrounding the specimen 104 and is also within the field of view of the XD 102, the remainder of the stage 106 may be constructed of non-magnetic material as appropriate for use in the instrument. The specimen stage 106 advantageously is connected to the specimen stage positioning mechanism, which is part of the SEM or TEM/STEM.

The electron beam stop (EBS) 112 and the window 120 serve to protect the X-ray detector (XD) 102 from electrons otherwise directly propagating to the detector. In systems having unacceptable environments for XD operation, the window 120 and its peripheral components can also be hermetically sealed to protect the XD 102 from degradation due to environmental related issues such as poor vacuum, contamination or other deleterious conditions which might damage the detector.

Each of the X-ray detectors (XDs) 102, 124 is fabricated from Si, Si (Li), Ge or other semi-conducting material, which produces a detectable signal that is proportional to the energy deposited in the material by incident photons, electrons or other charged particles. The XDs 102, 124 in this invention may be made up of a single monolithic detector, an annulus, or an array of detectors arranged in a space filling geometry.

Figure 3:
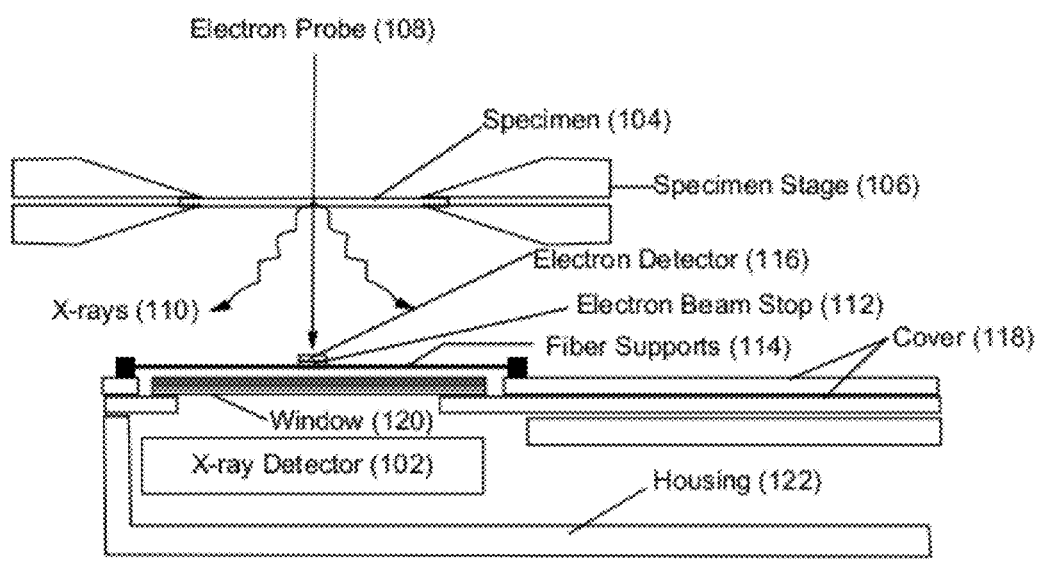
FIG. 3 illustrates a transmission X-ray spectrometer system including a x-ray detector (XD) positioned below a specimen in accordance with the preferred embodiment.
Figure 4:
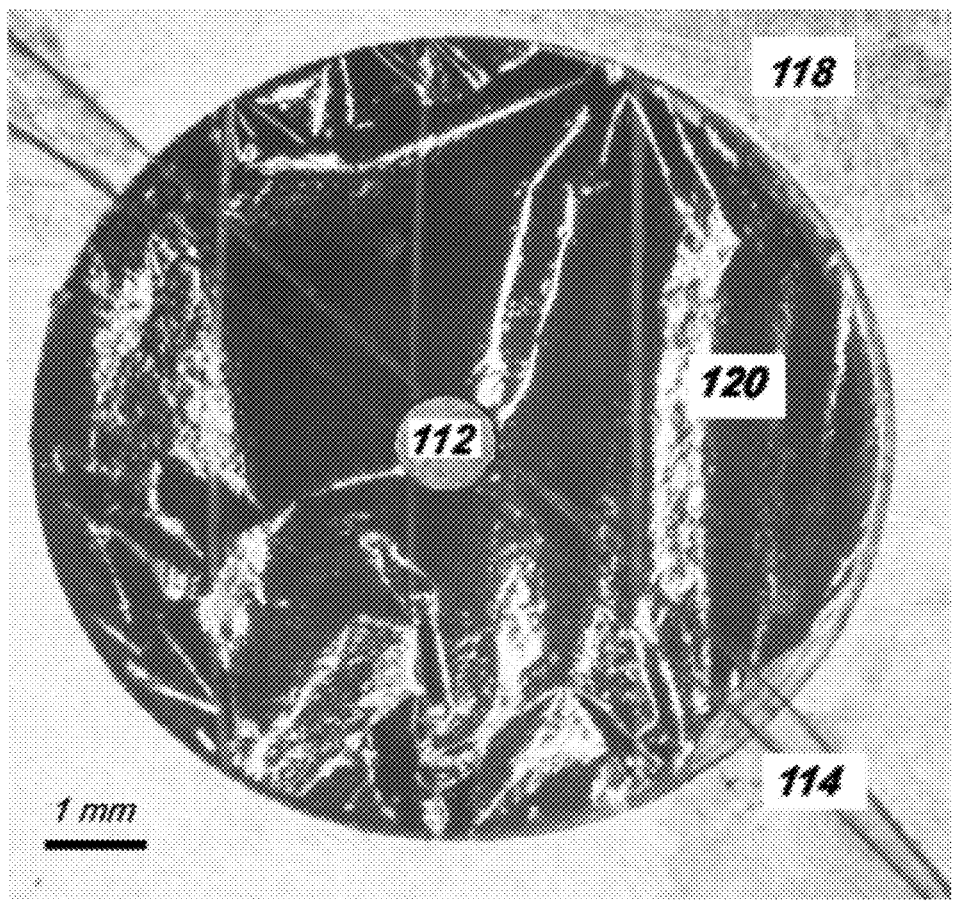
FIG. 4 illustrates an example of integrated electron beam stop of FIG. 3 supported by carbon fibers affixed to a cover plate which in turn is mounted on top of a diamond exchangeable window reinforced by carbon fibers on a removable cover plate, in accordance with the preferred embodiment.

FIG. 4 illustrates and example of integrated electron beam stop 112 of FIG. 3 supported by a plurality of fine wires or 100 $\mu$m diameter carbon fibers 114 affixed to an Aluminum cover plate 118 on top of a 300 nm thick diamond exchangeable window implementing the environmental isolation window 120 supported by 100 $\mu$m fibers 114 on a separate Al cover plate 118.

Figure 5:
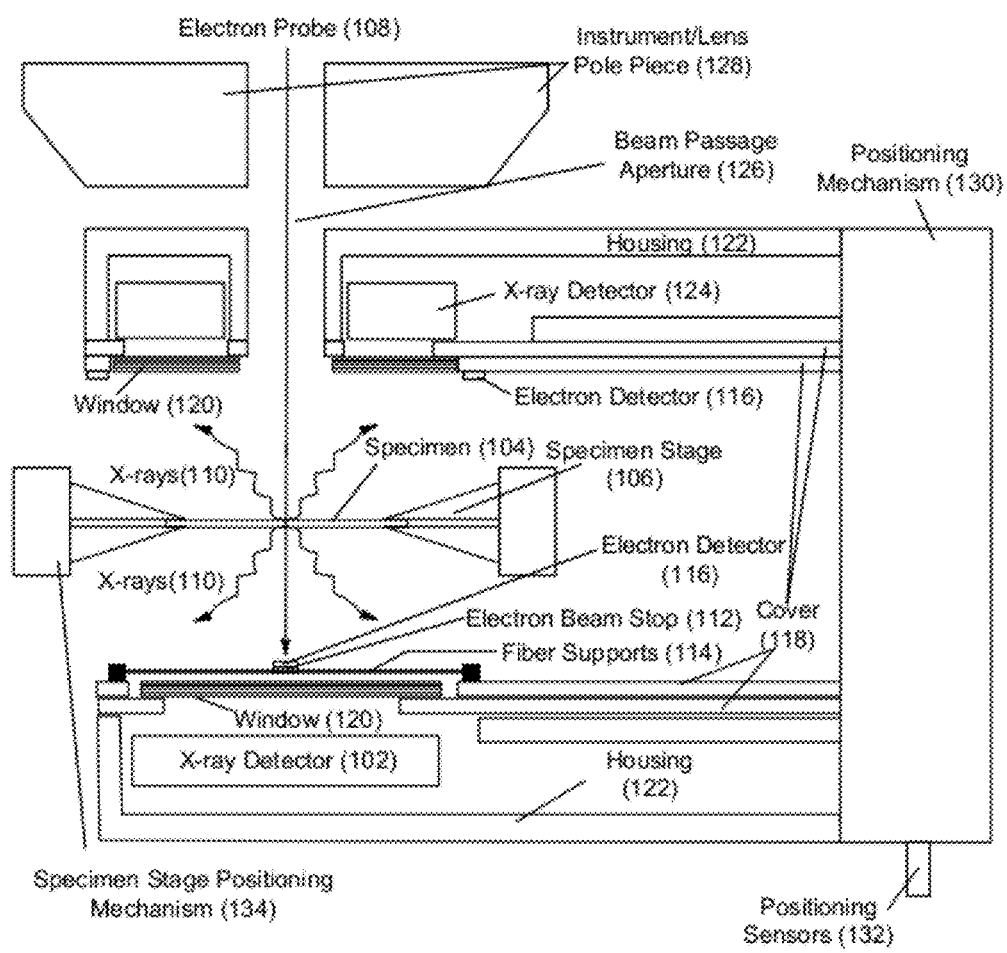
FIG. 5 illustrates an X-ray spectrometer system including an X-ray detector (XD) positioned below a specimen in accordance with the preferred embodiment and incorporating annular or segmented XD above the specimen; and a respective integrated electron detector above and below the specimen in accordance with the preferred embodiment.

FIG. 5 illustrates an X-ray spectrometer system including the X-ray detector (XD) 102 positioned below a specimen 104 in accordance with the preferred embodiment and incorporating annular or segmented XD 124 above the specimen 104; and a respective integrated electron detector 116 above and below the specimen 104 in accordance with the preferred embodiment.

The annular or multiple element X-ray detector (XD) 124 can be incorporated above the specimen and operates in synchronism with the X-ray detector 102 located below as shown in FIG. 5. This annular or multiple segmented XD 124 can increase the overall collection solid angle of the system to approximately $2\pi$ steradians, by collecting X-ray emitted from the electron entrance surface, which are not detected using the post-specimen XD 102 in the configuration shown in FIG. 3. In this enhanced configuration as shown in FIG. 5, a beam passage aperture 126 is required and allows the incident electron beam to pass through the space above the specimen 104 uninhibited so as to reach the specimen. Signal from both the post specimen and pre specimen X-ray detectors 102, 124 are processed by suitable hardware and software and merged to provide a more statistically developed signal. As before the EBS 112 and ECW 120 is interfaced between the specimen 104 and the XD 102; however the EBS 112 is not employed in the upper XD 124 as it would block the incident probe 108.

The XD124 is positioned in a housing 122 including the beam passage aperture 126. The XD124 is positioned between or around the perimeter of the microscope lens pole piece 128 and the specimen 104, which is supported by a specimen holder 106. Retraction and positioning stages or mechanisms 130 with positioning sensors 132 or mechanical stops and specimen positioning stages or mechanisms 134 allow the simple and routine insertion/removable of either or both of the upper and lower XD detectors 124, 102, and positioning of the specimen 104. These proximity sensors 132 and stops allow the detectors 102, 124 to be located at optimized distances from the specimen 104. This is particularly important for any annular or segmented detector 124 having the beam passage aperture 126.

The X-ray detector (XD) 102 as illustrated in FIGS. 3 and 5 is located closely spaced to a thin specimen 104 in the electron-optical instrument, minimizing the distance between the XD and the specimen to enhance data collection ability of the X-ray signal. When located below the specimen 104 the XD 102 is protected from direct electron bombardment by the electron beam stop (EBS) 112. The electron beam stop 112 is centrally located on the electron-optical axis and in between the specimen 104 and the XD 102. The EBS 112 is supported by electrically conductive material preferably in the form of small cross-section wires, fibers, or bars 114. These support fibers 114 have a mean atomic number $\leq 29$, the preferred material being carbon-based (Z=6). The fibers 114 have a nominal cross-section of $\leq 100$ µm and are as long as needed to support the electron beam stop 112. The number and orientation of the fibers 114 is chosen to minimize their deleterious effect on the active area of the XD 102 yet provide both support as well as serve as an electrical connection pathway. In addition the choice of material for these fibers 114 is such so not to create significant spurious X-ray systems peaks.

The electron beam stop (EBS) 112 as well as customized, exchangeable and removable windows 120 are disposed between X-ray detector (XD) 102 and the specimen 104 in FIGS. 3, and 5. The electron beam stop 112 and the window 120 serve to protect the detector (XD) 102 from electrons directly propagating to the detector. The EBS 112 is not included in the system of FIG. 6, with a respective window 120 positioned between the XD 124 and the specimen, and positioned between the XD 102 and the specimen.

In accordance with the features of the invention, the annular or multiple element X-ray detector (XD) 124 is incorporated above the specimen 104, operating in synchronism with the X-ray detector 102 located below the specimen 104 as shown in FIG. 5. This feature can increase the overall collection solid angle of the system to approximately $2\pi$ steradians, by collecting X-ray emitted from the electron entrance surface, which are not detected using the post-specimen 102 in the configuration of XSS 100 shown in FIG. 3. In this enhanced configuration the beam passage aperture 126 is required and allows the incident electron beam 108 to pass through the space above the specimen 104 uninhibited so as to reach the specimen 104. Signals from both the post specimen 102 and pre specimen X-ray detector 124 are processed by suitable hardware and software and merged to provide a more statistically developed signal. The respective ECW 120 is interfaced between the specimen 104 and the XD 124; however the EBS 112 is not employed with the upper XD 124 as it would block the incident probe 108. The annular electron detector (ED) 116 is amenable to this geometry, and is located at either or both of the inner or outer peripheries of the ECW 120.

In systems having unacceptable environments for XD operation, the window 120 and its peripheral components can also be hermetically sealed to protect the XD from degradation due to environmental related issues such as poor vacuum, contamination or other deleterious conditions which might damage the detector. Single or multiple electron detectors (EDs) are located between the specimen and the XD in the XSS, for example, near the location of the EBS or the ECW.

The electron beam stop (EBS) 114 is composed of a stack of two small diameters, for example, ~0.5-2 mm disks of different electrically conductive materials. A first disk or layer which is in closest proximity to the specimen has an atomic number (Z)$\leq 14$, the preferred material is Be (Z=3). The second disk is located directly beneath the first and closest to the detector has a high atomic number (Z$\geq 42$). Tantalum (Z=79), is the preferred material. Each of these disks is typically 100 µm thick.

The primary purpose of this EBS 112 is to stop electrons, which may be directly transmitted through the region of interest of the specimen 104 from reaching the XD 102. The physics of the electron scattering process is such that the majority of transmitted electrons propagating through thin specimens are confined for the most part to small scattering angles, thus, they are mainly concentrated about the electron-optical axis and as such strike the EBS 112. Because of this process these electrons do not impinge upon the XD 102, and do not create unwanted and/or spurious signal. The combination of low Z/hi Z materials used in the EBS 112 is chosen to minimize X-ray production by any electron, which strikes the EBS 112 and might create a detectable X-ray signal. Thus, electrons interacting with the first layer of the EBS 112, because of its low atomic number, result in minimal X-ray production. While it is not possible to completely eliminate the generation of X-ray signal in the first layer of the EBS, any X-ray signal created in the first layer is subsequently absorbed in the high atomic number second layer. Since the EBS 112 is metallic and supported using electrically conductive fibers 114, the EBS 112 may also be connected to an external power supply providing a positive potential to its surface. Further, this positive potential creates the equivalent of miniature electrostatic lens/electrode in front of the XD 102 and in this role enhances the EBS shielding effect, by attracting the negatively charged electrons in its immediate vicinity. The magnitude of the applied potential is controlled by an external power supply and can be adjusted by the user. This further increases the effective shielding afforded by the simple mechanical barrier that the EBS metallic disks physically represent. In the absence of an EBS 112, an electrically connected thin metallic ring may be installed at the periphery of the ECW 120, to perform a similar electrostatic lens functionality. It is inevitable that a small number of high angle scattered electrons will circumvent the EBS due to its limited spatial influence. Due to the ensemble of innovations described above these are of significantly reduced number and do not obviate an analysis, however, as an additional protective measure, the presence of the ECW 120 after the EBS 112 also mitigates deleterious effects. The EBS 112 is mounted upon an exchangeable cover 118 or covers 118, which can be mounted or exchanged on the XSS 100 to optimize the system configuration for peak performance. In addition a current measuring device may be connected to the EBS 112 allowing the measurement of electron current striking the EBS, which can then be used to create an image.

It should be understood that electrostatic beam traps are potential additions, which can be incorporated into the electron beam stop 112. This is considered a refinement, which can help further reduce any circumvention electron flux.

In conventional XEDS systems, electron beam stops or traps generally consist of permanent magnets installed within the detector immediately behind the environmental isolation window. Due to the proximity of a permanent magnet to the specimen at the precise location of focused electron beam, this solution is not practical with the XD 102 and the integral electron beam stop 112. The magnetic field strength and the geometry necessary for a magnetic trap at this location to be successful would adversely affect the incident electron beam, thus distorting the focused beam and decreasing the imaging resolution. The integral electron beam stop 112 does not introduce this limitation.

Figure 6:
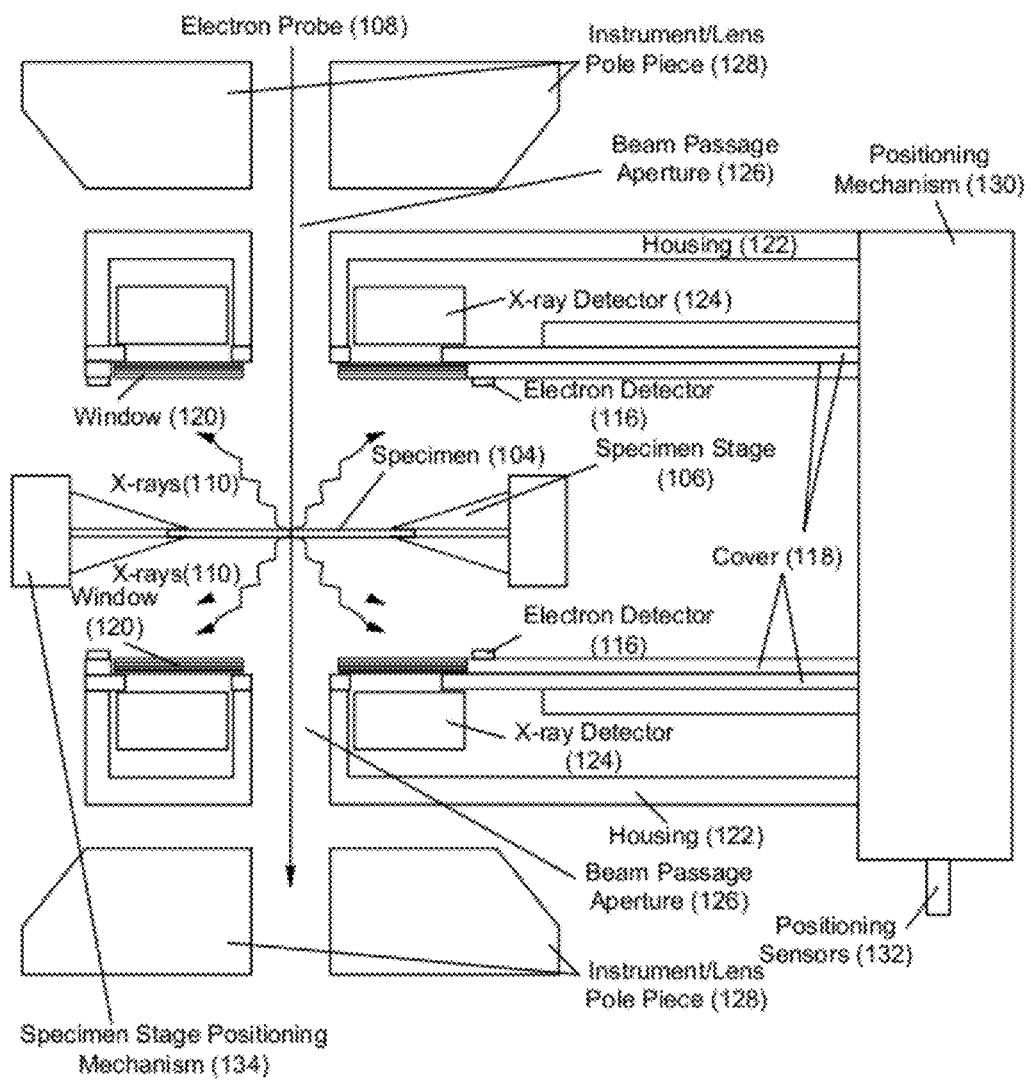
FIG. 6 illustrates an X-ray spectrometer system including an annular or segmented X-ray detector (XD) positioned below a specimen in accordance with the preferred embodiment and incorporating annular or segmented XD above the specimen; and a respective integrated electron detector above and below the specimen in accordance with the preferred embodiment.

Single or multiple electron detectors (EDs) 116 are located between the specimen 104 and the XD 102 in the XSS, for example, near the location of the EBS 112 as shown in FIGS. 3 and 5, and near the location of the ECW 120 as shown in FIGS. 5 and 6.

FIG. 6 illustrates an X-ray spectrometer system including an annular or segmented X-ray detector (XD) 124 positioned below the specimen 104 in accordance with the preferred embodiment and incorporating annular or segmented XD 124 above the specimen 104; and a respective integrated detector 116 above and below the specimen 106 in accordance with the preferred embodiment. The configuration of FIG. 6 would be typically used in a transmission or scanning transmission electron microscope (TEM or STEM) environment to permit the electron beam 108 to further interact with post-specimen lenses as well as additional systems. This refinement includes the change including lower detector 124 and incorporating a beam exit aperture 126 instead of a beam stop 112 to permit simultaneous transmission electron spectroscopy and imaging.

The environmental isolation window 120 is a customizable and removable electrically conductive window (ECW). The ECW 120 is composed of a single or a multi-layered thin film with mean atomic number $\leqq 14$, such as beryllium (Be), boron (B), diamond (C), hydrocarbon polymers, aluminum (Al), silicon (Si), or associated compounds; such as such as BN, AlN, AlO, SiN, SiO. The ECW 120 is also a protective device for the XD 102, 124 and one of its roles in this invention is to diminish high angle scattered electron flux from reaching the XD 102, 124 due to the collective scattering of electrons beyond the subtending angle defined by the EBS. The structure and composition of the window material is also selected to minimize UV/VIS/IR photons from reaching the XD and creating low energy signal/noise. Thus in the event of an optically transparent window, such as diamond, the closest of the multi-layers to the XD will be selected based upon its ability to block/reflect UV/VIS/IR photons. Due to its high reflectivity, Al, is a suitable choice. The ECW 120, when installed, is located just prior to the XD 102, 124 and when an EBS 112 is present it is located between the specimen 104 and the XD 102 of FIGS. 3, and 5. The thickness of the ECW is typically less than 15 microns and may be as thin as 100 nm, the choice depending upon the window materials used and the application needed. In the situation where the thickness or areal extent of the window is such that it cannot be made self-supporting then electrically conductive fibers as used for the electron beam stops are employed to support the ECW. The ECW is mounted upon an exchangeable cover so that the user may optimize the system configuration for peak performance for the materials being studied. This cover may also be hermetically sealed to the XSS housing providing an isolation of the XD in cases of harsh or unsuitable environments. The preferred exchangeable cover material is of atomic number $\leqq 14$, however in harsh environments this can be relaxed to provide appropriate safekeeping of the XD. In some experimental arrangements the ECW may be omitted from the system enabling "windowless" operation. The remainder of the XSS system can be enclosed in an appropriate non-magnetic metallic housing such as stainless steel.

The XSS positioning mechanisms 130, 132 includes a positioning drive, for example, which is interfaced to the associated microscope/beam line and allows the insertion, retraction, and three dimensional adjustment and alignment of the XSS to the electron-optical axis while the specimen 104 is in position or removed from the instrument. Sensors 132 or mechanical stops are provided with the positioning mechanism 130 for accurate repositioning of the detector 102, 124, once initial alignment has been established. Sensors 132 or mechanical stops also provide safety interlocks should the specimen 104 or the specimen stage 106 come in contact with the XSS.

Figure 7:
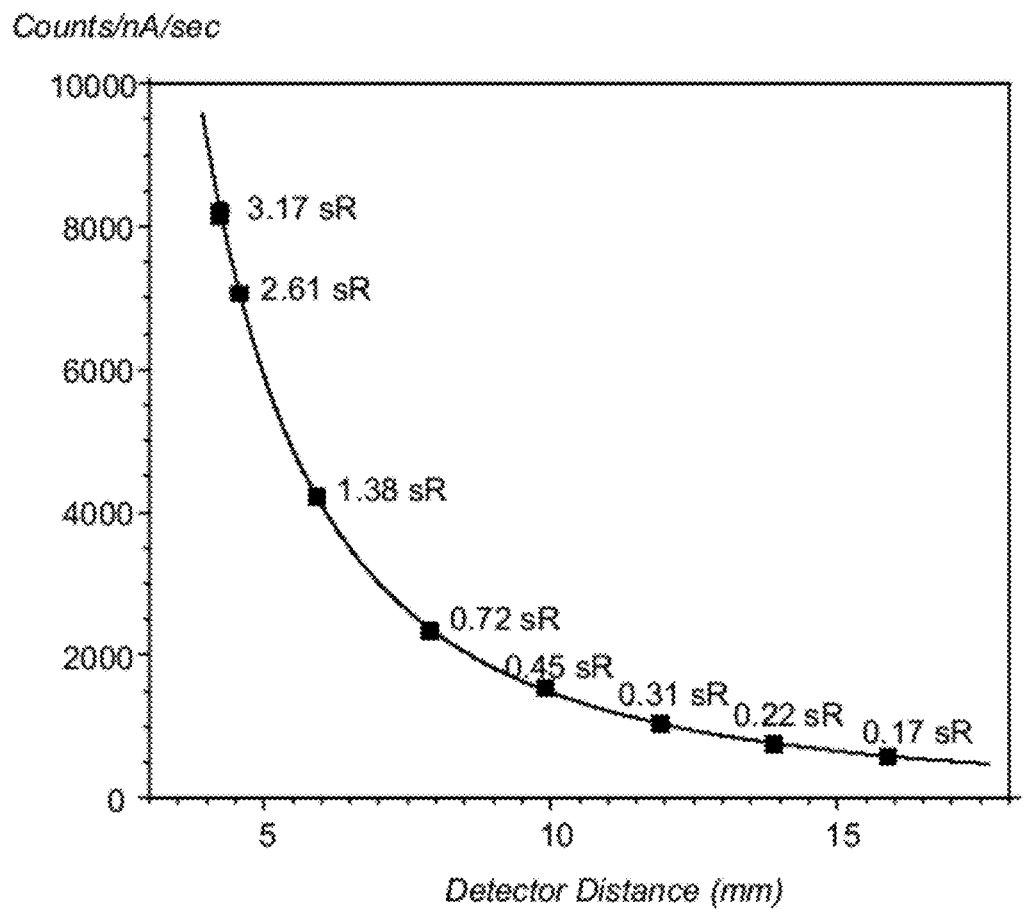
FIG. 7 is chart illustrating experimentally measured Au L$\alpha$ integrated X-ray peak intensity (data points) as a function of detector-specimen distance and illustrating the ability to achieve a solid angle greater than $\pi$ sr in accordance with the preferred embodiment.

FIG. 7 is chart illustrating experimentally measured Au L$\alpha$ integrated X-ray peak intensity (data points) as a function of detector-specimen distance in accordance with the preferred embodiment illustrating the ability to achieve a solid angle greater than $\pi$ sr. Solid line is a least squares fit to the variation in the counts/nA/sec, for example, represented by:

$$y=1.479e+5*x\char`\^(-2.0011), R\ 0\ 0.99996$$

The numerical values next to each data point (3.17, 2.61 ... 0.17) represent the solid angle of the detector realized at each location. At the closest distance tested, the detector solid angle just exceeds $\pi$ sr.

Figure 8A:
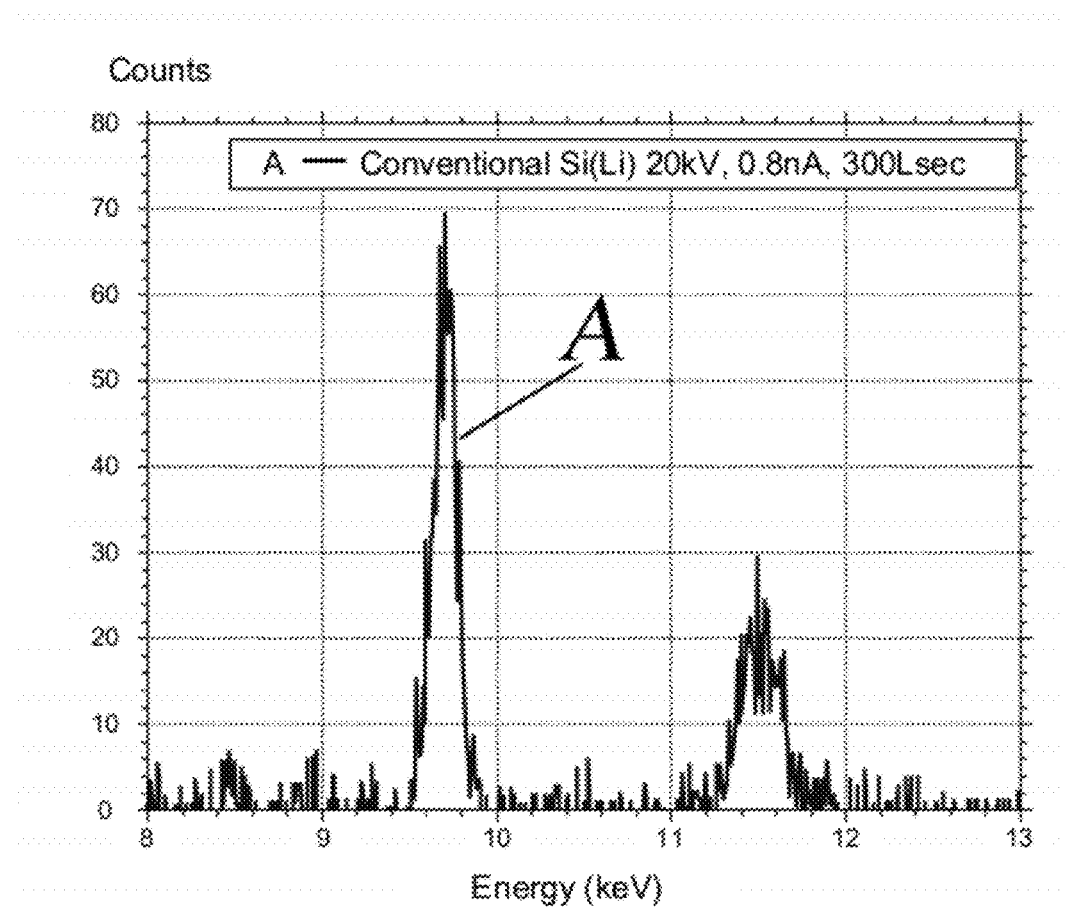
FIG. 8A is chart illustrating a X-ray spectra from a thin Au film obtained using from conventional technology detector obtained with a beam current of 0.8 nA.
Figure 8B:
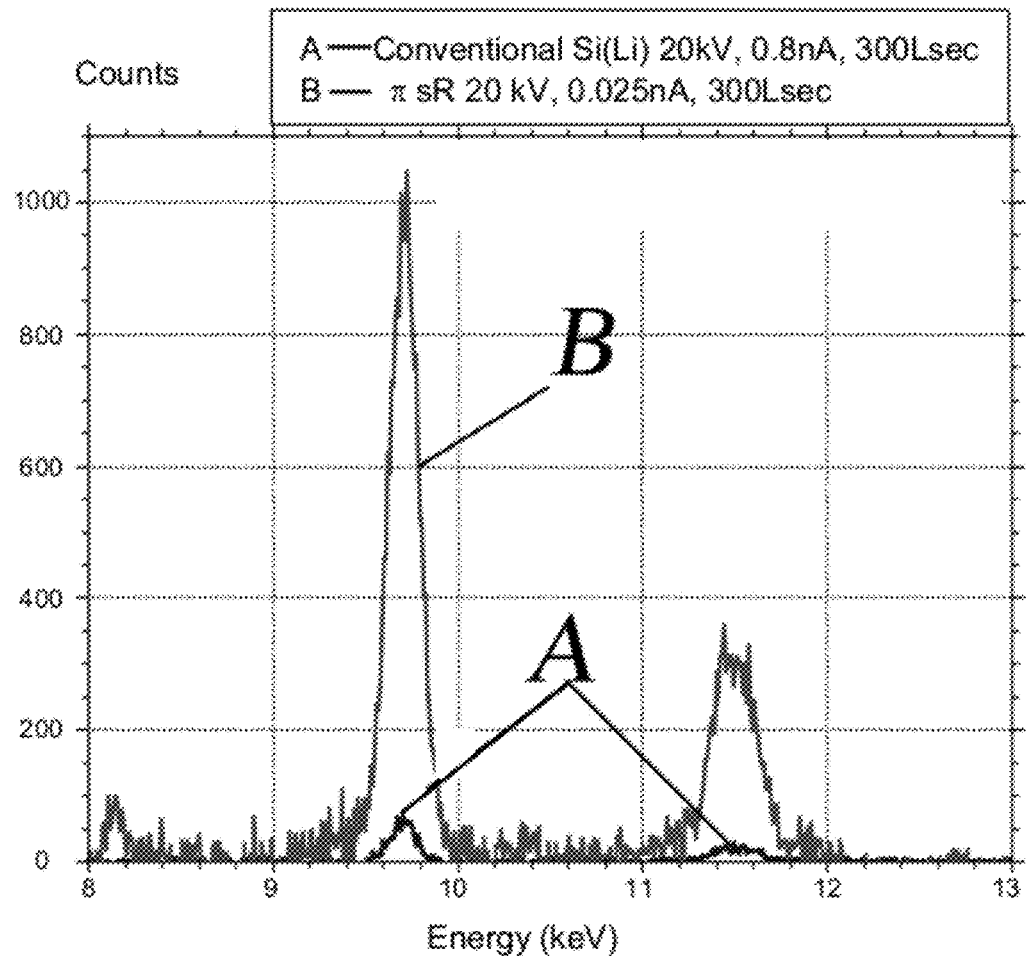
FIG. 8B is chart illustrating an X-ray spectrum from the current invention using a current of 0.025 nA in accordance with the preferred embodiment with the same specimen as FIG. 8A.
Figure 8C:
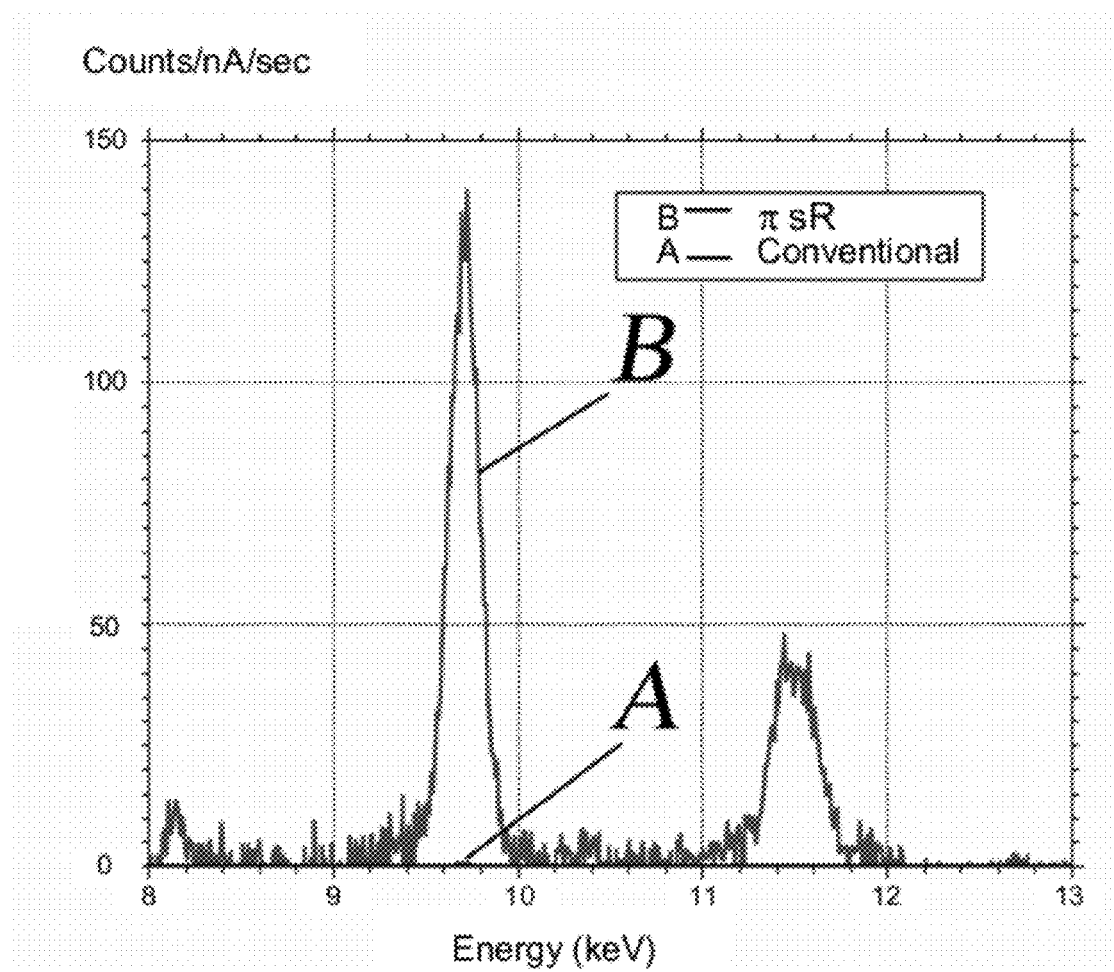
FIG. 8C is chart providing a comparison of spectra of FIGS. 8A and 8B scaled to the same incident beam current and analysis time; illustrating a net improvement by a factor of ~500× in accordance with the preferred embodiment.

Referring now to FIGS. 8A, 8B, and 8C, enhanced performance of the XD 102 of the invention may be understood. FIG. 8A illustrates an X-ray spectra indicated by line A with counts shown along the vertical axis from 0 to 80, and Energy (keV) shown along the horizontal axis. The X-ray spectra A is from a thin Au film specimen 104 obtained using from conventional technology detector obtained with a beam current of 0.8 nA.

FIG. 8B illustrates an X-ray spectrum indicated by line B from the XD 102 of the present invention with the same specimen 104 as used in FIG. 8A. The spectrum B is shown for comparison to FIG. 8A with the same acquisition time, but obtained with a beam current of only 0.025 nA.

FIG. 8C is chart providing a comparison of spectra A, B of FIGS. 8A and 8B scaled to the same incident beam current and analysis time; illustrating a net improvement by a factor of ~500×. The net data from FIG. 8A is so reduced in intensity that it is not practically visible on this FIG. 8C.

Figure 9:
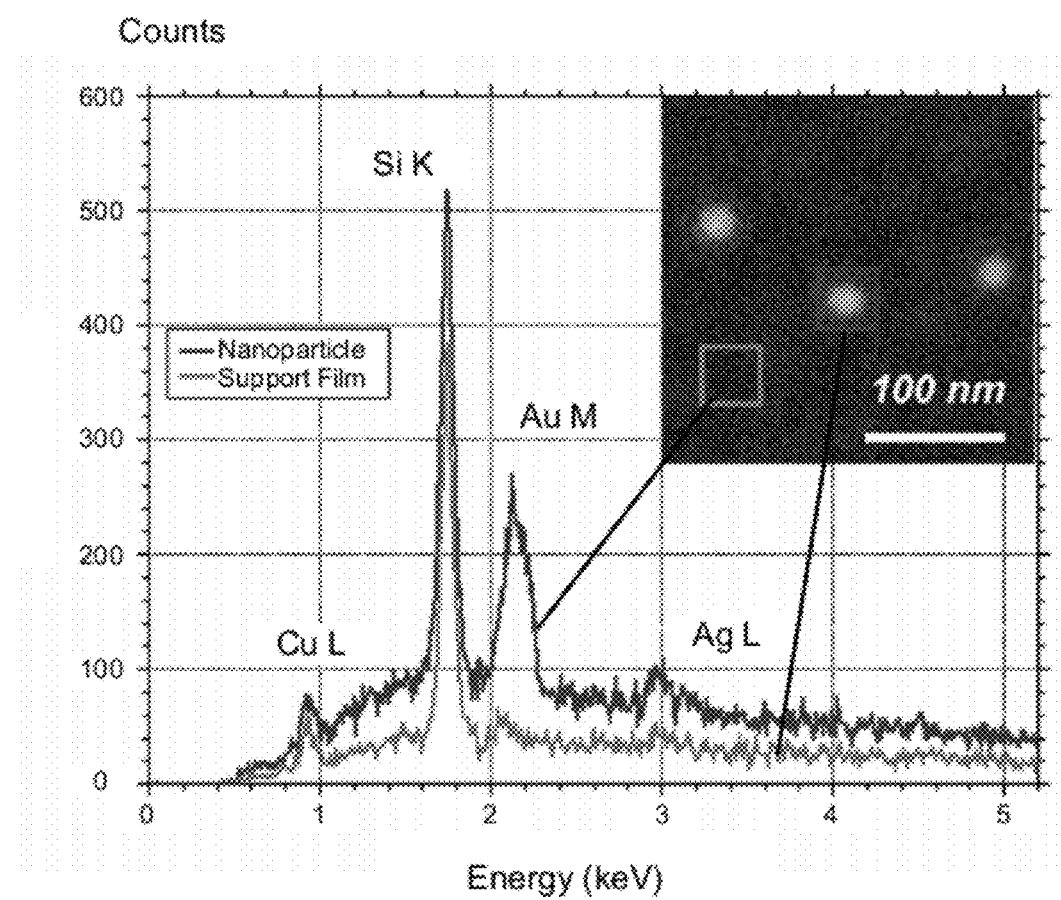
FIG. 9 is chart illustrating experimentally measured X-ray spectrum obtained from an approximately 20 nm diameter Au catalyst nano-particle illustrated in an inset and compared to the background signal from the thin SiO support film recorded using this invention.

FIG. 9 is chart illustrating experimentally measured X-ray spectrum obtained from an approximately 20 nm diameter Au catalyst nano-particle illustrated in an inset and compared to the background signal from the thin SiO support film recorded using this invention. The integrated peak intensity of the Au M lines is 2725 counts, acquisition time=20 live seconds, and the beam current=0.025 nA at 20 keV.

It should be understood that the present invention includes various other configurations of the system 100 and XDD 102. Various modifications to the conventional SEM stages can be provided to permit the optimized holding of TEM specimens for use with the combined X-ray detectors 102, 124 and integrated electron detectors 116. A related configuration can be provided to use in a TEM/STEM instrument, for example, as shown in FIG. 6.

The XDs 102, 124 may be implemented with a commercially available or modified Sapphire Si(Li)/Apollo SDD X-ray Detector manufactured by EDAX Inc. of 91 McKee Drive, Mahwah, N.J. 07430 (http://www.edax.com); or by a commercially available or modified EvexQDD-Violin X-ray Detector manufactured by Evex Analytical of 857 State Road, Princeton, N.J. 08540 (http://evex.com); or by a commercially available or modified X-Max SDD, PentaFET Si(Li) X-ray Detector manufactured by Oxford Instruments of Tubney Woods, Abingdon, Oxfordshire, OX13 5QX, UK (http://www.oxford-instruments.com). The XDs 102, 124 may be implemented with a commercially available or modified Vortex SDD X-ray Detector manufactured by SII NanoTechnology USA Inc. of 19865 Nordhoff Street, Northridge, Calif. 91324 (http://www.siintusa.com); or by commercially available or modified UltraDry 30 SDD X-ray Detector manufactured by Thermo Fisher Scientific Inc. (http://www.thermo.com); or a commercially available or modified XFlash SDD X-ray Detector manufactured by Bruker-AXS Microanalysis of 1239 Parkway Avenue, Suite 203, Ewing, N.J. 08628 (http://www.bruker-axs.com). Electron Microscope Manufacturers include AXS JEOL USA Inc., 11 Dearborn Road, Peabody, Mass. 01960 USA (http://www.jeol.com); Hitachi High Technology America, 5100 Franklin Drive, Pleasanton, Calif. 94588-3355, (http://www.hitachi-hta.com); FEI Company, North America NanoPort, 5350 NE Dawson Creek Drive, Hillsboro, Oreg. 97124 USA (http://www.fei.com); and Carl Zeiss SMT Inc. (http://www.zeiss.com/nts). Moxtek Inc. of 452 West 1260 North, Orem, Utah 84057 (http://www.moxtek.com/) manufactures X-ray windows.

It should be understood that the above provide examples and there are other manufacturers and other models, and model modifications that could be used to implement components of the invention.

While the present invention has been described with reference to the details of the embodiments of the invention shown in the drawing, these details are not intended to limit the scope of the invention as claimed in the appended claims.

What is claimed is:

1. A transmission X-ray spectrometer system for implementing signal detection for use on electron-optical beam lines and microscopes comprising:
    an X-ray detector (XD), said XD being positioned proximate to a specimen;
    an environmental isolation window together with an electron beam stop being disposed between said XD and the specimen; said environmental isolation window and said electron beam stop protecting said XD from electrons scattered from the specimen; said electron beam stop being formed by a stack of disks of different electrically conductive materials; and
    said XD detecting an X-ray signal.

2. The transmission X-ray spectrometer system as recited in claim 1 wherein said XD being positioned below and proximate to a specimen, minimizing a distance between said XD and the specimen to enhance data collection ability of the X-ray signal, said XD being formed of a semiconductor material.

3. The transmission X-ray spectrometer system as recited in claim 1 wherein said environmental isolation window is removable, said environmental isolation window is formed of a selected material having mean atomic number of less than or equal 14.

4. The transmission X-ray spectrometer system as recited in claim 1 wherein said environmental isolation window includes a layer to stop radiation of energy of less than 50 eV from reaching said XD.

5. The transmission X-ray spectrometer system as recited in claim 1 wherein said electron beam stop is located above and near a center of said environmental isolation window between the specimen and said environmental isolation window.

6. The transmission X-ray spectrometer system for implementing signal detection for use on electron-optical beam lines and microscopes comprising:
    an X-ray detector (XD), said XD being positioned proximate to a specimen;
    an environmental isolation window together with an electron beam stop being disposed between said XD and the specimen; said environmental isolation window and said electron beam stop protecting said XD from electrons scattered from the specimen; said electron beam stop being supported by a plurality of fine wires over said environmental isolation window; and
    said XD detecting an X-ray signal.

7. The transmission X-ray spectrometer system recited in claim 1 wherein said electron beam stop is formed of said stack of two small diameter disks in a range of approximately 0.5-2 mm diameters of said different electrically conductive materials.

8. The transmission X-ray spectrometer system as recited in claim 1 wherein said stack includes a first layer disposed closest proximity to the specimen having an atomic number less than or equal to 14, and a second disk having an atomic number greater than or equal to 42.

9. The transmission X-ray spectrometer system as recited in claim 1 wherein said electron beam stop is formed of layers of beryllium and tantalum, each layer approximately 100 μm (micrometer) thick.

10. The transmission X-ray spectrometer system as recited in claim 1 includes at least one electron detector.

11. The transmission X-ray spectrometer system as recited in claim 1 includes a positioning mechanism, and said positioning mechanism is interfaced to an associated microscope.

12. The transmission X-ray spectrometer system for implementing signal detection for use on electron-optical beam lines and microscopes comprising:
    an X-ray detector (XD), said XD being positioned proximate to a specimen;
    an environmental isolation window together with an electron beam stop being disposed between said XD and the specimen; said environmental isolation window and said electron beam stop protecting said XD from electrons scattered from the specimen;
    a positioning mechanism; said positioning mechanism including a proximity sensor for accurate detector positioning; and
    said XD detecting an X-ray signal.

13. The transmission X-ray spectrometer system as recited in claim 1 includes an annular detector, said annular detector having a beam passage aperture to permit the incident electron beam to strike the specimen.

14. The transmission X-ray spectrometer system as recited in claim 1 wherein said environmental isolation window includes a customizable, removable electrically conductive window (ECW), which is composed of a single or a multilayered thin film with mean atomic number $\leq 14$.

15. A method for configuring a transmission X-ray spectrometer system used on electron-optical beam lines for implementing X-ray signal detection, said method comprising:
    providing a X-ray detector (XD) positioned proximate to a specimen;
    providing an environmental isolation window together with an electron beam stop between said XD and the specimen; said environmental isolation window and said electron beam stop protecting said XD from electrons scattered from the specimen;
said electron beam stop being formed by a stack of disks of different electrically conductive materials;
providing a positioning mechanism; said positioning mechanism including a proximity sensor for accurate detector positioning; and
detecting an X-ray signal with said XD.

16. The method for configuring a transmission X-ray spectrometer system as recited in claim 15 wherein providing an environmental isolation window together with an electron beam stop between said XD and the specimen includes forming said environmental isolation window of a selected material having mean atomic number of less than or equal 14.

17. The method for configuring a transmission X-ray spectrometer system as recited in claim 15 wherein providing an environmental isolation window together with an electron beam stop between said XD and the specimen includes providing an electron detector positioned above and near said electron beam stop below the specimen.

18. The method for configuring a transmission X-ray spectrometer system as recited in claim 15 wherein providing an environmental isolation window together with an electron beam stop between said XD and the specimen includes positioning said electron beam stop located above and near a center of said environmental isolation window between the specimen and said environmental isolation window.

19. A transmission X-ray spectrometer system for implementing signal detection for use on electron-optical beam lines and microscopes comprising:
  an X-ray detector (XD), said XD being positioned proximate to a specimen;
  an environmental isolation window being disposed between said XD and the specimen; said environmental isolation window protecting said XD from electrons scattered from the specimen;
  a positioning mechanism; said positioning mechanism including a proximity sensor for accurate detector positioning; and
  said XD detecting an X-ray signal.

20. The transmission X-ray spectrometer system as recited in claim 19 wherein said XD includes an annular X-ray detector, and a beam passage aperture extending though said environmental isolation window and said annular X-ray detector.

* * * * *